United States Patent
Kim

(10) Patent No.: US 7,532,530 B2
(45) Date of Patent: May 12, 2009

(54) SEMICONDUCTOR MEMORY DEVICE

(75) Inventor: Dong-Keun Kim, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 226 days.

(21) Appl. No.: 11/528,521

(22) Filed: Sep. 28, 2006

(65) Prior Publication Data
US 2007/0070777 A1 Mar. 29, 2007

(30) Foreign Application Priority Data
Sep. 29, 2005 (KR) .................. 10-2005-0091545
May 30, 2006 (KR) .................. 10-2006-0049003

(51) Int. Cl.
G11C 7/02 (2006.01)

(52) U.S. Cl. ............. 365/207; 365/185.23; 365/189.04; 365/230.06

(58) Field of Classification Search ................. 365/207, 365/185.23, 189.04, 230.06
See application file for complete search history.

(56) References Cited

U.S. PATENT DOCUMENTS

| 5,629,900 | A | | 5/1997 | Hirose et al. |
| 6,043,685 | A | * | 3/2000 | Lee .............................. 327/52 |
| 6,058,068 | A | | 5/2000 | Wilkins |
| 6,172,918 | B1 | | 1/2001 | Hidaka |
| 6,292,427 | B1 | | 9/2001 | Roy |
| 6,347,058 | B1 | * | 2/2002 | Houghton et al. ........... 365/203 |
| 6,414,897 | B1 | | 7/2002 | Hardee et al. |
| 6,421,297 | B1 | * | 7/2002 | Huber .................... 365/230.06 |
| 6,457,094 | B2 | | 9/2002 | Zheng |
| 6,765,844 | B2 | | 7/2004 | Fujisawa et al. |
| 6,853,593 | B1 | * | 2/2005 | Bae ........................ 365/189.09 |
| 7,054,204 | B2 | | 5/2006 | Lim et al. |
| 7,173,875 | B2 | * | 2/2007 | Chan et al. ............. 365/230.06 |
| 7,362,631 | B2 | * | 4/2008 | Jang ........................... 365/201 |
| 2006/0041804 | A1 | * | 2/2006 | Do .............................. 714/724 |

FOREIGN PATENT DOCUMENTS

| JP | 2000-173269 | 6/2000 |
| KR | 1020020032394 A | 5/2002 |
| KR | 1020050102238 A | 12/2004 |
| KR | 1020050041055 A | 5/2005 |
| TW | TN 493174 | 7/2002 |

OTHER PUBLICATIONS

Korean Office Action, issued in corresponding Korean Patent Application No. 9-5-2007-049563156, issued on Sep. 13, 2007.
Taiwanese Search Report issued in Taiwanese Patent Application No. 95134511, dated Nov. 5, 2008.

* cited by examiner

*Primary Examiner*—Pho M. Luu
(74) *Attorney, Agent, or Firm*—Mannava & Kang P.C.

(57) ABSTRACT

A semiconductor memory device can reduce a data writing time. The semiconductor memory device includes a bit line sense amplifier connected to a pair of bit lines. A pair of first local lines id connected to the pair of bit lines by a first switching unit. A pair of second local lines is connected to the pair of first local lines by a second switching unit. A writing driver drives the second local lines using a normal-driving voltage in response to a data signal through a global line. The writing driver drives the second local lines using an over-driving voltage having a higher level than that of the normal-driving voltage during a predetermined period.

17 Claims, 4 Drawing Sheets

SEMICONDUCTOR MEMORY DEVICE

The present application contains subject matter related to the Korean patent application NOS. KR 2005-0091545 and KR 2006-49003, filed in the Korean Patent Office respectively on Sep. 29, 2005, and on May 30, 2006, the entire contents of which being incorporated herein by reference.

FIELD OF THE INVENTION

The present invention relates to a semiconductor memory device, and more particularly, to a writing driver in the semiconductor memory device.

BACKGROUND

FIG. 1 is a circuit diagram of a conventional semiconductor memory device.

As shown, the semiconductor memory device includes a cell array 101, a bit line sense amplifier 102, a first connecting unit 103, a second connecting unit 104, a data bus sense amplifier 105, a writing driver 106, an input/output pad 107, first local lines SLO/SLOb, second local lines LIO/LIOb and a global line GIO. A plurality of resistors R1 to R4 are parasitic resistors loaded on the first and the second local lines SLO/SLOb and LIO/LIOb.

The cell array 101 includes word lines WL0 and WL1, bit lines BL and BLb and unit cells S1 and S2. The unit cells S1 and S2 are respectively arranged at the intersections of the word lines and the bit lines. If the word line WL0 is enabled, a data signal of the unit cell S2 is provided to the bit line BLb. If word line WL1 is activated, a data signal stored in the unit cell S1 is provided to the bit line BL and a predetermined reference signal is supplied to the bit line BLb.

The bit line sense amplifier 102 senses and amplifies signals of the bit lines BL and BLb. The first connecting unit 103 connects the bit lines BL and BLb to the first local lines SLO and SLOb, respectively according to YIT. The second connecting unit 104 connects the first local lines SLO and SLOb to the second local lines LIO and LIOb, respectively in response to SLOT. The data bus sense amplifier 105 senses and amplifies signals of the second local lines LIO and LIOb, and drives the global line GIO in response to the amplified signals. The signal supplied at the global line by the data bus sense amplifier 105 is output externally as data corresponding to a read command.

The writing driver 106 drivers the second local lines LIO and LIOb based on a data signal supplied at the global line GIO. The data signal supplied at the global line GIO is input received externally through the input/output pad 107.

Main operation of the semiconductor memory device includes a write operation and read operation. At the write operation, the semiconductor memory device stores a data unit provided from the external into a unit cell selected by an address input with the data. At the read operation, the semiconductor memory device outputs a data unit selected by an address of read operation into the external.

At the writing operation, a selected word line, e.g., WL1 is activated and a data signal stored at the unit cell S1 is provided to the bit line BL. The sense amplifier 102 senses, amplifies, and latches the data signal of the bit line BL. An input data signal is transferred to the global line GIO through the input/output pad 107. The writing driver 106 drives the second local lines LIO and LIOb based on the input data signal supplied at the global line GIO. Since the first connecting unit 103 and the second connecting unit 104 are enabled during the writing operation, the input data signal is transferred to the bit line sense amplifier 102 through the local lines LIO/LIOb and SIO/SIOb. If the input data signal is different from the data signal latched by the sense amplifier 102, the bit line sense amplifier 102 removes the latched data signal and newly latches the input data signal. The input data signal newly latched by the bit line sense amplifier 102 is stored at the unit cell S1.

The read operation is similar to the write operation except that the data bus sense amplifier 105 is used instead of the writing driver 106 and the direction that data signal moves is reverse. Thus, description of the read operation is omitted.

FIG. 2 is a schematic circuit diagram of a writing driver in FIG. 1.

As shown, the writing driver 106 includes a first data transferring unit 106A, a second data transferring unit 106B, a first writing driver 106C, and a second writing driver 106D. The first data transferring unit 106A receives and latches a signal based on a data signal supplied at the global data line GIO in response to a reset signal LIORSTb and an enable signal BWEN. The second data transferring unit 106B receives and latches a signal based on an inverted signal of the data signal supplied at the global data line GIO in response to the reset signal LIORSTb and the enable signal BWEN. The first writing driver 106C pulls up or pulls down the second local line LIO using the signal latched by the first data transferring unit 106A and the signal latched by the second data transferring unit 106B. The first writing driver 106D pulls up or pulls down the second local line LIOb using the signal latched by the first data transferring unit 106A and the signal latched by the second data transferring unit 106B.

If the reset signal LIORSTb is a logic low level, PMOS transistors P1 and P3 are turned on. Outputs of latches L1 and L2 are respectively a logic low level. Then, MOS transistors P2, P4, N3 and N6 are turned off.

If the reset signal LIORSTb is a logic high level and the enable signal BWEN is a logic high level, MOS transistors N1 and N4 are turned on and MOS transistors P1 and P3 are turned off. Assume that an input data signal of the write operation is logic high level. Then, MOS transistor N2 is turned on and the latch L1 of the first data transferring unit 106A latches and outputs a signal having a logic high level. Alternatively, MOS transistors N5 are turned off and the latch L4 of the second data transferring unit 106B latches and outputs a signal having a logic low level. Thus, the MOS transistors P2 and N6 are turned off and the MOS transistors N3 and P4 are turned on. The second local line LIO is pulled down as a level of a core voltage VCORE and the second local line LIOb is pulled up as a level of a ground voltage VSS.

To reduce power consumption, the semiconductor memory device uses the core voltage VCORE that is lower than the external power supply voltage as an operating voltage at a core area. Thus, the first writing driver 106C drives the second local line LIO as a pull-up level of the core voltage VCORE. The second writing driver 106D drives the second local line LIOb as a pull-up level of the core voltage VCORE.

However, because of parasitic resistance on the local lines LIO/LIOb and SIO/SIOb, it takes too much time to transfer a data signal from the writing driver into a unit cell. That is, the data writing time of the semiconductor memory device is too long.

SUMMARY OF THE INVENTION

It is, therefore, an object of the present invention to provide a semiconductor memory device and an operation method thereof, which can reduce data writing time.

In accordance with an aspect of the present invention, there is provided a semiconductor memory device, including: a bit line sense amplifier connected to a pair of bit lines; a pair of first local lines connected to the pair of bit lines by a first switching unit; a pair of second local lines connected to the pair of first local lines by a second switching unit; and a writing driver for driving the second local lines with using a normal-driving voltage in response to a data signal through a global line, wherein the writing driver drives the second local lines using an over-driving voltage having a higher level than that of the normal-driving voltage during a predetermined period.

In accordance with another aspect of the present invention, there is provided a method for operating a semiconductor memory device, including: receiving a data signal through a global line in response to a write command; first driving a local line as an over-driving voltage in response to the data signal of the global line; second driving the local line as a normal-driving voltage in response to the data signal of the global line wherein the normal-driving voltage is lower than the over-driving voltage; latching a data signal of the local line using a bit line sense amplifier; and transferring the latched data into a unit cell.

In accordance with another aspect of the present invention, there is provided a semiconductor memory device, including: a pair of local lines; a global line; a writing driving unit for driving the local lines as a normal-driving voltage in response to a data signal input by a write command through the global line wherein the writing driving unit drives the local line as an over-driving voltage having a higher level than the normal-driving voltage during a predetermined period.

BRIEF DESCRIPTION OF THE DRAWINGS

The above and other objects and features of the present invention will become better understood with respect to the following description of the exemplary embodiments given in conjunction with the accompanying drawings, in which.

DETAILED DESCRIPTION OF THE INVENTION

An internal voltage generation circuit in accordance with various embodiments of the present invention will be described in detail with reference to the accompanying drawings.

Figure 3:
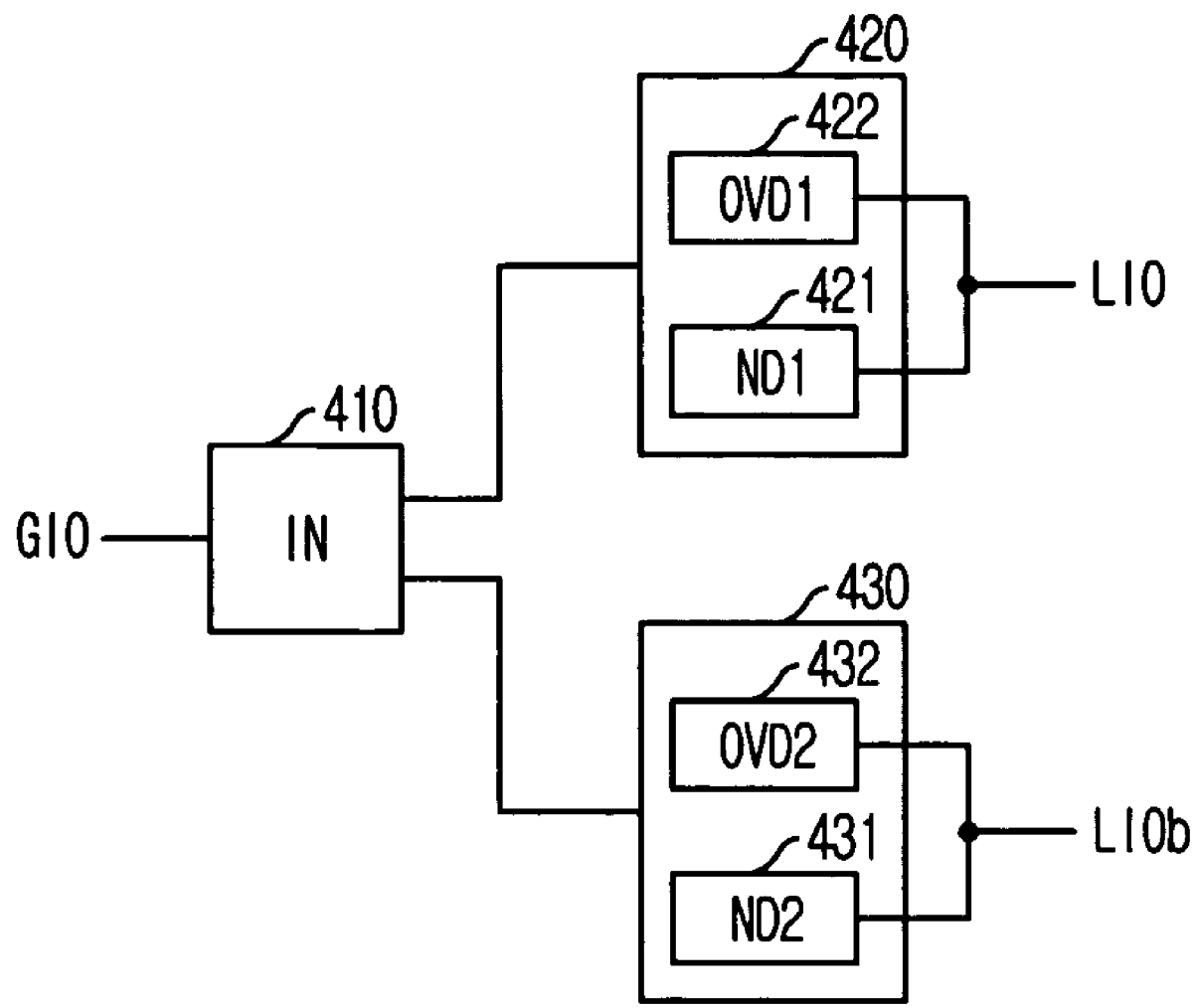
FIG. 3 is a block diagram of a writing driver in a semiconductor memory device in accordance with an embodiment of the present invention.

FIG. 3 is a block diagram of a writing driver in a semiconductor memory device in accordance with an embodiment of the present invention.

As shown, the writing driver in the semiconductor memory device includes a writing data receiver 410, a first writing driver 420, and a second writing driver 430. The first writing driver 420 includes a first normal-driving unit 421 and a first over-driving unit 422. The second writing driver 430 includes a second normal-driving unit 431 and a second over-driving unit 432.

The writing data receiver 410 receives a data signal through a global line GIO and transfers the data signal to the first writing driver 420 and the second writing driver 430. The first normal-driving unit 421 drives a first local line LIO as a normal voltage, i.e., a core voltage or a ground voltage corresponding to the data signal from the writing data receiver 410. The first over-driving unit 422 drives the first local line LIO as over-driving voltage during a predetermined period.

The second normal-driving unit 431 drives a second local line LIOb as a normal voltage, i.e., the core voltage or the ground voltage corresponding to the data signal from the writing data receiver 410. The second over-driving unit 432 drives the second local line LIOb as an over-driving voltage during a predetermined period.

Figure 4:
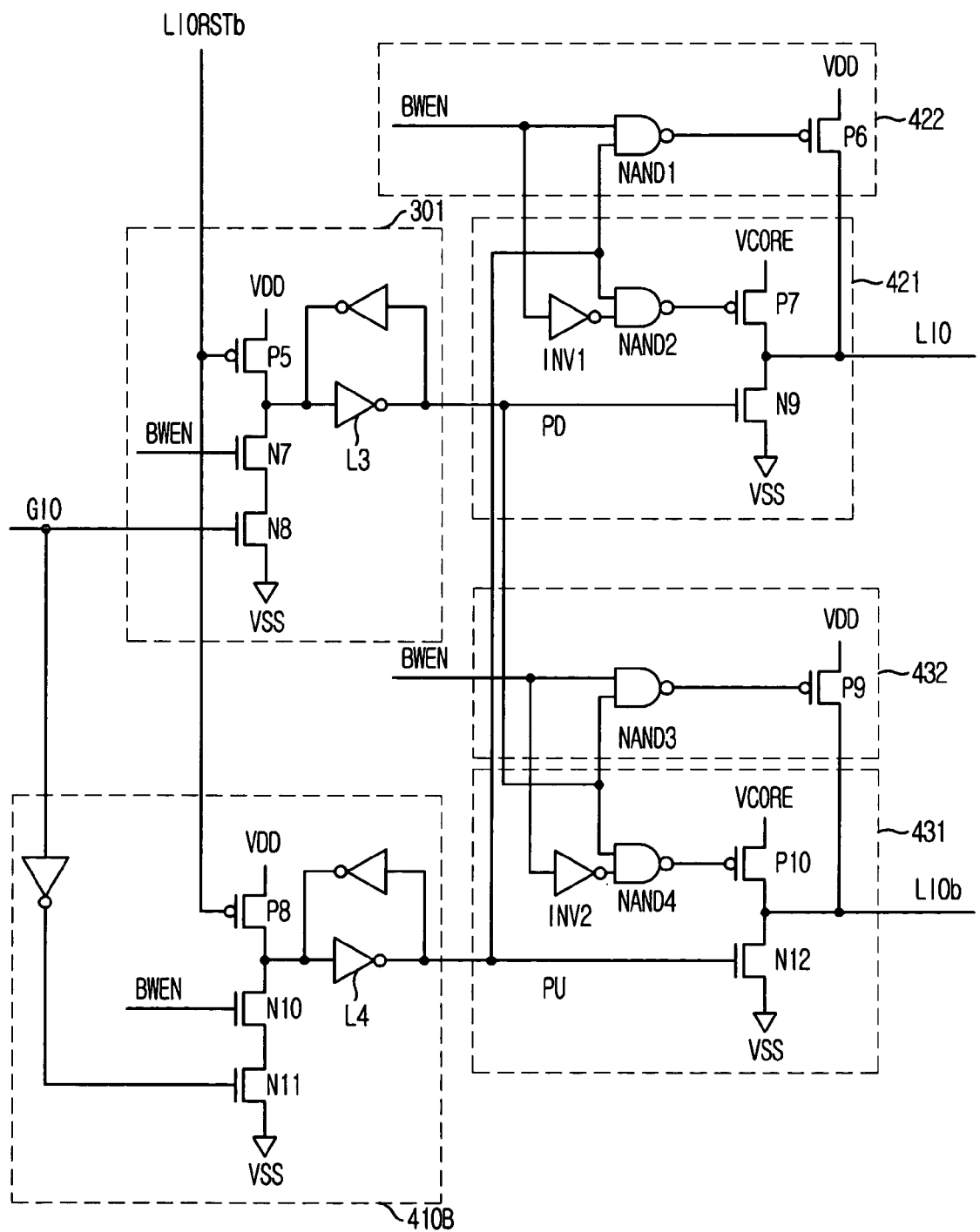
FIG. 4 is a detailed schematic circuit diagram of the writing driver in the semiconductor memory device illustrated in FIG. 3.

FIG. 4 is a detailed schematic circuit diagram of the writing driver in the semiconductor memory device illustrated in FIG. 3.

As shown, the writing driver includes a first writing data receiving unit 410A, a second writing data receiving unit 420A, a first normal-driving unit 421, a first over-driving unit 422, a second normal-driving unit 431, and a second over-driving unit 432.

The first writing data receiving unit 410A is controlled by a reset signal LIORSTb and an enable signal BWEN receives and latches a signal corresponding to a data signal through the global line GIO and latches the data signal. The enable signal EWEN is a signal for enabling the writing driver and the reset signal LIORSTb is a signal for resetting the local lines LIO and LIOb. The second writing data receiving unit 410B is controlled by the reset signal LIORSTb and the enable signal BWEN receives and latches a signal corresponding to an inverted signal of the data signal.

The first normal-driving unit 421 drives the local line LIO as a core voltage VCORE or a ground voltage VSS in response to the latched signal by the first writing data receiving unit 410A. The first over-driving unit 422 controlled by the enable signal BWEN drives the first local line LIO as an over driving voltage, i.e., power supply voltage VDD. The second normal-driving unit 431 drives the second local line LIOb as the core voltage VCORE or the ground voltage VSS in response to the latched signal by the second writing data receiving unit 410B. The second over-driving unit 432 controlled by the enable signal BWEN drives the second local line LIOb as an over driving voltage, i.e., the power supply voltage VDD.

Hereinafter, the schematic circuits of the writing driver are described in detail.

The first writing data receiving unit 410A includes a PMOS transistor P5 having a gate connected to the reset signal LIORSTb, a NMOS transistor N7 having a gate connected to the enable signal BWEN, a NMOS transistor N8 having a gate connected to the global line GIO, and a latch L3 for latching a signal supplied at a node between the PMOS transistor P5 and the NMOS transistor N7. The second writing data receiving unit 410B includes a PMOS transistor P8 having a gate connected to the reset signal LIORSTb, a NMOS transistor N10 having a gate connected to the enable signal BWEN, a NMOS transistor N11 having a gate for receiving an inverted signal of data signal of the global line GIO, and a latch L4 for latching a signal supplied at a node between the PMOS transistor P8 and the NMOS transistor N10.

The first normal-driving unit 421 includes inverter INV1 for inverting the enable signal BWEN, a logic NAND gate NAND2 for receiving an output of the inverter INV1 and an output of the latch L4 to output a result of logic NAND operation, a PMOS transistor P7 having a gate connected to an output of the logic NAND gate NAND2, and a NMOS transistor N9 having a gate connected to an output of the latch L3. The PMOS transistor P7 has one terminal connected to the core voltage VCORE and the other terminal connected to the first local line LIO. The NMOS transistor N9 has one terminal connected to the ground voltage VSS and the other terminal connected to the first local line LIO.

The first over-driving unit 422 includes a logic NAND gate NAND1 for receiving the enable signal BWEN and the output of the latch L4 to output a result of logic NAND operation, and a PMOS transistor P6 having a gate connected to an output of the logic NAND gate NAND1. The PMOS transistor P6 has one terminal connected to the power supply voltage VDD and the other terminal connected to the first local line LIO.

The second normal-driving unit 431 includes inverter INV2 for inverting the enable signal BWEN, a logic NAND gate NAND4 for receiving an output of the inverter INV2 and the output of the latch L3 to output a result of logic NAND operation, a PMOS transistor P10 having a gate connected to an output of the logic NAND gate NAND4, and a NMOS transistor N12 having a gate connected to an output of the latch L4. The PMOS transistor P10 has one terminal connected to the core voltage VCORE and the other terminal connected to the second local line LIOb. The NMOS transistor N12 has one terminal connected to the ground voltage VSS and the other terminal connected to the second local line LIOb.

The second over-driving unit 432 includes a logic NAND gate NAND3 for receiving the enable signal BWEN and the output of the latch L3 to output a result of logic NAND operation, and a PMOS transistor P9 having a gate connected to an output of the logic NAND gate NAND3. The PMOS transistor P9 has one terminal connected to the power supply voltage VDD and the other terminal connected to the second local line LIOb.

Hereinafter, operations of the writing driver in accordance to this embodiment are described.

At first, because the reset signal LIORSTb is activated as a logic low level when a command is not input, the latches L3 and L4 output signals PD and PU as a logic low level, respectively. When a writing command is input and a data signal is supplied to the global line GIO, the reset signal LIORSTb is inactivated as a logic high level and the enable signal BWEN is activated as a logic high level.

If the data signal supplied to the global line GIO is a logic high level, the NMOS transistor N8 of the first writing data receiving unit 410A is turned on. Then, the latch L3 latches and outputs a signal PD as a logic high level. The NMOS transistor N9 of the first normal-driving unit 421 is turned on and drives the first local line LIO as the ground voltage VSS. The output of the latch L4, i.e., the signal PU is maintained as a logic low level.

While the enable signal is a logic high level, the second over-driving unit 432 drives the second local line LIOb as an over-driving voltage, i.e., the power voltage VDD. While the enable signal is a logic high level, the logic NAND gate NAND3 of the second over-driving unit 432 outputs the output signal as a logic low level. Then, the PMOS transistor P9 is turned on and drives the second local line LIOb as the power voltage VDD.

While the enable signal is a logic low level, the second normal-driving unit 431 drives the second local line LIOb as the core voltage VCORE. While the enable signal is a logic low level, the logic NAND gate NAND4 of the second normal-driving unit 431 outputs the output signal as a logic low level. Then, the PMOS transistor P10 is turned on and drives the second local line LIOb as the core voltage VCORE. A bit line sense amplifier latches a data signal of the local lines LIO and LIOb. The latched data is transferred into a unit cell.

If the data signal supplied to the global line GIO is a logic low level, the NMOS transistor N11 of the first writing data receiving unit 410B is turned on. Then, the latch L4 latches and outputs a signal PU as a logic high level. The NMOS transistor N12 of the first normal-driving unit 431 is turned on and drives the second local line LIOb as the ground voltage VSS. The output of the latch L3, i.e., the signal PD is maintained as a logic low level.

While the enable signal is a logic high level, the second over-driving unit 422 drives the first local line LIO as an over-driving voltage, i.e., the power voltage VDD. While the enable signal is a logic high level, the logic NAND gate NAND1 of the first over-driving unit 422 outputs the output signal as a logic low level. Then, the PMOS transistor P6 is turned on and drives the second local line LIO as the power voltage VDD.

While the enable signal is a logic low level, the second normal-driving unit 421 drives the first local line LIO as the core voltage VCORE. While the enable signal is a logic low level, the logic NAND gate NAND2 of the first normal-driving unit 421 outputs the output signal as a logic low level. Then, the PMOS transistor P17 is turned on and drives the first local line LIO as the core voltage VCORE.

As described above, the writing driver according to the present invention drives the local lines LIO and LIOb using the over-driving voltage during a predetermined period. The level of the over-driving voltage is higher than that of the normal-driving voltage. The over-driving voltage according to above described embodiment is the power supply voltage VDD and the normal-driving voltage is the core voltage VCORE. The core voltage VCORE is used as the operating voltage of the bit line sense amplifier.

The writing driver doesn't drive the local lines LIO and LIOb only using the normal-driving voltage but drives the local lines LIO and LIOb using the over-driving voltage during a predetermined period, i.e., an initial period of driving the local lines LIO and LIOb for transferring a data signal from the global line GIO to the local lines LIO and LIOb.

Figure 1:
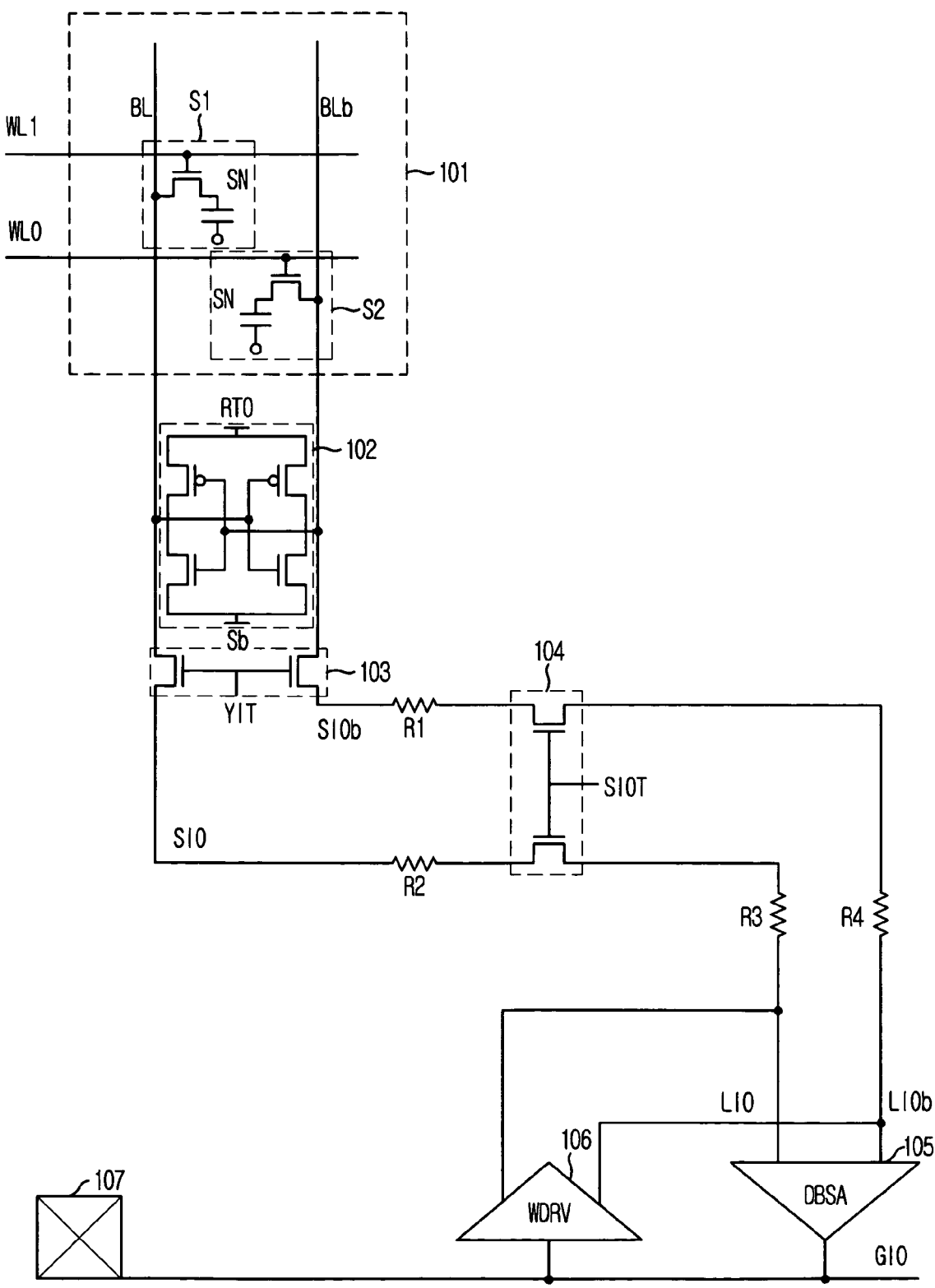
FIG. 1 is a circuit diagram of a semiconductor memory device.
Figure 2:
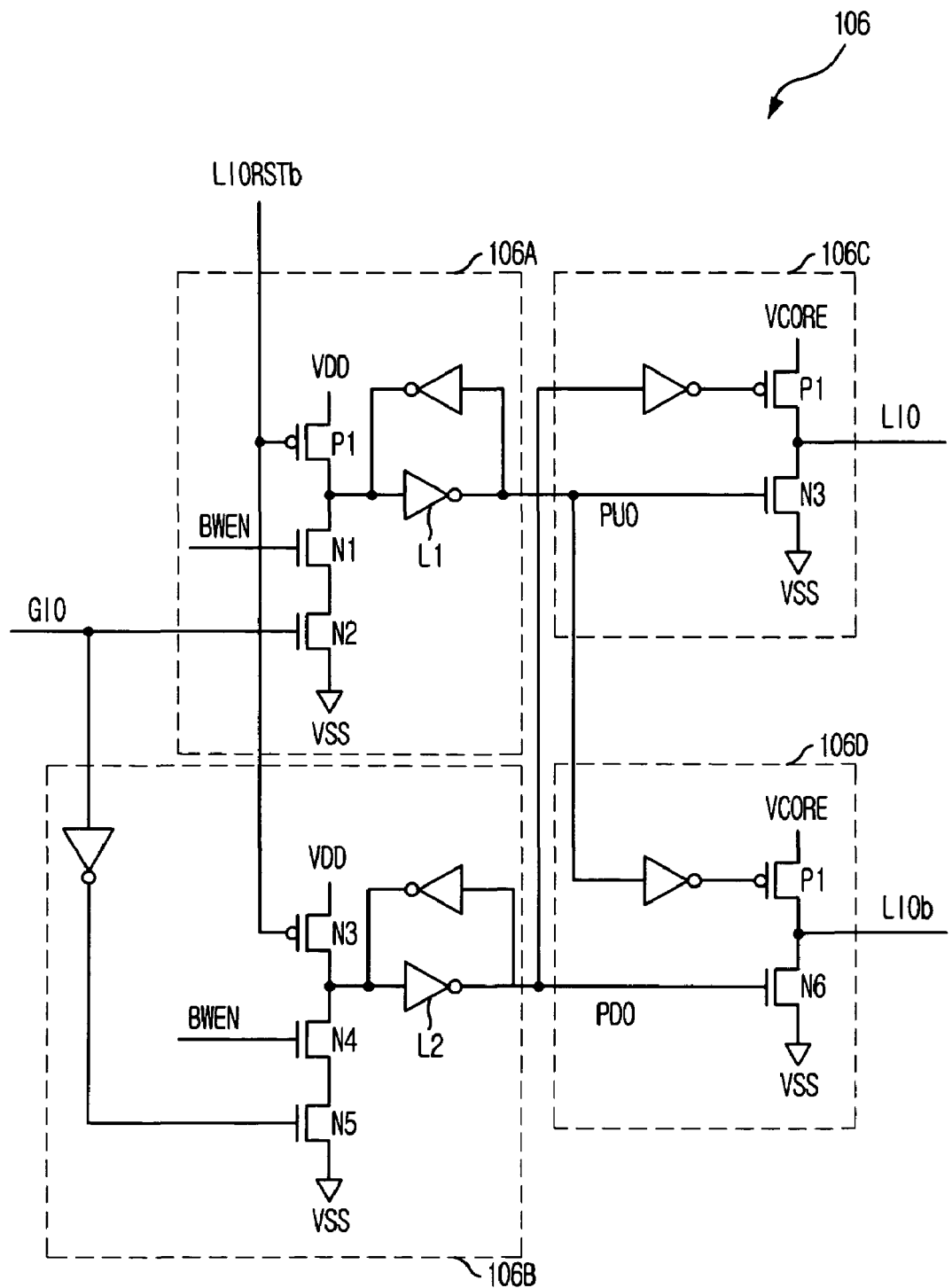
FIG. 2 is a schematic circuit diagram of a writing driver in FIG. 1.

If a local line is too long in the conventional semiconductor memory device, it takes too much time to transfer a voltage corresponding to a data signal to bit line sense amplifier from a global line. However, because the writing driver in the semiconductor memory device according to the present invention drives local lines with using an over-driving voltage during a predetermined period, the time taken to transfer a voltage corresponding to a data signal to bit line sense amplifier from a global line can be reduced. Also, the activation time of a connecting unit (refer to 103 of FIG. 1) for connecting a bit line sense amplifier to a local line can be reduced. Therefore, data writing time in the semiconductor memory device can be reduced.

The schematic circuit diagram of the writing driver according to above described embodiment can be modified based on the kind of input signals of an activation logic level of the input signals. In the described embodiment, the over-driving voltage is higher than the normal-driving voltage. However, the over-driving voltage can be lower than the ground voltage VSS in another embodiment.

While the present invention has been described with respect to certain preferred embodiments, it will be apparent to those skilled in the art that various changes and modifications may be made without departing from the spirit and scope of the invention as defined in the following claims.

What is claimed is:

1. A semiconductor memory device, comprising:
a bit line sense amplifier connected to a pair of bit lines;

a pair of first local lines connected to the pair of bit lines by a first switching unit;

a pair of second local lines connected to the pair of first local lines by a second switching unit; and a writing driver for driving the second local lines with a normal-driving voltage in response to a data signal through a global line, wherein the writing driver drives the second local lines with an over-driving voltage having a higher level than the normal-driving voltage during a predetermined period.

2. The semiconductor memory device of claim 1, wherein the normal-driving voltage is a voltage for operating the bit line sense amplifier.

3. The semiconductor memory device of claim 1, wherein after the writing driver drives the second local lines with using the over-driving voltage, the writing driver drives the second local lines with the normal-driving voltage.

4. The semiconductor memory device of claim 1, wherein the writing driver includes:

a first receiving unit for receiving the data signal, controlled by a reset signal for resetting the second local lines and an enable signal for enabling the writing driver;

a second receiving unit for receiving an inverted signal of the data signal, controlled by a reset signal for resetting the second local lines and an enable signal for enabling the writing driver;

a first driving unit for driving one of the second lines as a power supply voltage or a core voltage in response to outputs of the first and second receiving units and the enable signal; and a second driving unit for driving the other of the second lines as a power supply voltage or a core voltage in response to outputs of the first and second receiving units and the enable signal.

5. The semiconductor memory device of claim 4, wherein the first receiving unit includes:

a first PMOS transistor having a gate connected to the reset signal;

a first NMOS transistor having a gate connected to the enable signal;

a second NMOS transistor having a gate connected to the global line; and a first latch for latching a signal supplied at a node between the first PMOS transistor and the first NMOS transistor.

6. The semiconductor memory device of claim 5, wherein the second receiving unit includes:

a second PMOS transistor having a gate connected to the reset signal;

a third NMOS transistor having a gate connected to the enable signal;

a fourth NMOS transistor a gate for receiving an inverted signal of data signal of the global line; and a second latch for latching a signal supplied at a node between the second PMOS transistor and the third NMOS transistor.

7. The semiconductor memory device of claim 6, wherein the first driving unit includes:

a first normal driver for driving the one of the second lines as the core voltage;

a first over driver for driving the one of the second lines as the power supply voltage;

a first inverter for inverting the enable signal;

a first NAND gate for performing a NAND operation with an output of the first inverter and an output of the second receiving unit to output a control signal for operating the first normal driver; and a second NAND gate for performing a NAND operation with the enable signal and an output of the second receiving unit to output a control signal for operating the first over driver.

8. The semiconductor memory device of claim 7, wherein the second driving unit includes:

a second normal driver for driving the other of the second lines as the core voltage;

a second over driver for driving the other of the second lines as the power supply voltage;

a second inverter for inverting the enable signal;

a third NAND gate for performing a NAND operation with an output of the second inverter and an output of the first receiving unit to output a control signal for operating the second normal driver; and a fourth NAND gate for performing a NAND operation with the enable signal and an output of the first receiving unit to output a control signal for operating the second over driver.

9. The semiconductor memory device of claim 1, wherein the predetermined period is an initial predetermined period for driving the second local lines to transfer data signals to the local lines.

10. A method for operating a semiconductor memory device, comprising:

receiving a data signal through a global line in response to a write command;

driving a local line as an over-driving voltage in response to the data signal of the global line;

driving the local line as a normal-driving voltage in response to the data signal of the global line wherein the normal-driving voltage is lower than the over-driving voltage;

latching a data signal of the local line using a bit line sense amplifier; and transferring the latched data into a unit cell.

11. The method of claim 10, wherein the driving as an over driving voltage is only performed during an initial predetermined period for driving the local lines to transfer a data signal to the local line.

12. The method of claim 10, wherein an operating voltage of the bit line sense amplifier is the normal-driving voltage.

13. A semiconductor memory device, comprising:

a pair of local lines;

a global line;

a writing driving unit for driving the local lines as a normal-driving voltage in response to a data signal input by a write command through the global line wherein the writing driving unit drives the local line as an over-driving voltage having a higher level than the normal-driving voltage during a predetermined period.

14. The semiconductor memory device of claim 13, further comprising:

a pair of bit lines;

a bit line sense amplifier for latching data signals of the local lines and transferring the latched data signals into the bit lines; and a connecting unit for connecting the bit line sense amplifier to the local lines.

15. The semiconductor memory device of claim 14, wherein the predetermined period is an initial predetermined period for driving the local lines to transfer data signals to the local lines.

16. The semiconductor memory device of claim 15, wherein the writing driving unit includes:

a first latch unit for latching a first logic level of the global line;

a second latch unit for latching a second logic level of the global line;

a first normal driver for driving the one local line of the local lines as the normal-driving voltage or a ground voltage in response to the latched signal by the first latch unit;

a second normal driver for driving the other local Line of the local lines as the normal-driving voltage or the ground voltage in response to the latched signal by the second latch unit;

a first over driver for driving the one local line as the over-driving voltage in response to the latched signals by the first and the second latch units; and a second over driver for driving the other local line as the over-driving voltage in response to the latched signals by the first and the second latch units.

17. The semiconductor memory device of claim 15, wherein the writing driving unit includes:

a latch unit for latching a data signal of the global line;

a normal driver for driving the local lines as the normal-driving voltage or a ground voltage in response to the latched signal by the latch unit; and a over driver for driving the local lines as the over-driving voltage in response to the latched signal by the second latch units.

* * * * *